(12) United States Patent
Kwon et al.

(10) Patent No.: US 7,151,031 B2
(45) Date of Patent: Dec. 19, 2006

(54) METHODS OF FABRICATING SEMICONDUCTOR DEVICES HAVING GATE INSULATING LAYERS WITH DIFFERING THICKNESSES

(75) Inventors: Hyung-Shin Kwon, Gyeonggi-do (KR); Soon-Moon Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 133 days.

(21) Appl. No.: 10/794,445

(22) Filed: Mar. 5, 2004

(65) Prior Publication Data

US 2004/0173854 A1    Sep. 9, 2004

(30) Foreign Application Priority Data

Mar. 6, 2003    (KR)    .................. 10-2003-0014045

(51) Int. Cl.
*H01L 21/8234*    (2006.01)
(52) U.S. Cl. ...................... 438/275; 438/981
(58) Field of Classification Search ............... 438/200, 438/201, 211, 258, 275, 950, 981
See application file for complete search history.

(56) References Cited

U.S. PATENT DOCUMENTS

| | | | |
|---|---|---|---|
| 5,937,299 A * | 8/1999 | Michael et al. ............ | 438/299 |
| 5,942,780 A | 8/1999 | Barsan et al. ............... | 257/321 |
| 6,093,945 A * | 7/2000 | Yang ........................... | 257/317 |
| 6,147,008 A | 11/2000 | Chwa et al. ................. | 438/762 |
| 6,265,267 B1 * | 7/2001 | Huang ......................... | 438/258 |
| 6,297,103 B1 | 10/2001 | Ahn et al. ................... | 438/275 |
| 6,720,221 B1 | 4/2004 | Ahn et al. ................... | 438/275 |

* cited by examiner

*Primary Examiner*—Chandra Chaudhari
(74) *Attorney, Agent, or Firm*—Myers Bigel Sibley & Sajovec, PA

(57) ABSTRACT

Semiconductor devices include a first gate pattern on a first active area of a semiconductor substrate. The first gate pattern has a top width that is substantially the same as or less than a bottom width of the first gate pattern. A second gate pattern is provided on a second active area of the semiconductor substrate. The second gate pattern has a top width that is wider than a bottom width of the second gate pattern. Semiconductor device are fabricated by forming a first gate pattern on a first gate insulation layer formed on a first active region of a semiconductor substrate. A mask insulation layer is formed on the semiconductor substrate that includes the first gate pattern. First and second gate openings respectively exposing second and third active regions of the semiconductor substrate are formed by patterning the mask insulation layer. Second and third gate insulation layers respectively are formed on second and third active regions exposed in the first and second gate openings. Second and third gate patterns are formed in the first and second gate openings respectively and the mask insulation layer is removed.

11 Claims, 6 Drawing Sheets

METHODS OF FABRICATING SEMICONDUCTOR DEVICES HAVING GATE INSULATING LAYERS WITH DIFFERING THICKNESSES

CLAIM OF PRIORITY

This application claims priority from Korean Patent Application No. 2003-14045, filed on 6 Mar. 2003, in the Korean Intellectual Property Office, the disclosure of which is hereby incorporated by reference in its entirety as if fully set forth herein.

FIELD OF THE INVENTION

The present invention relates to semiconductor devices, and more particularly, to semiconductor devices having multiple gate insulating layers and methods of fabricating the same.

BACKGROUND OF THE INVENTION

Developments in the semiconductor industry over the years have focused on a wide array of technical disciplines, device designs, and device packaging approaches in order to achieve improved semiconductor performance. Although many improvements have been obtained through device miniaturization, other improvements have resulted from creating multifunction devices on one semiconductor die. Such multi-function devices may have transistors that have different performance objectives that may be achieved through different physical characteristics of the transistors of the devices.

Triple gate oxide techniques may be used to improve characteristics of semiconductor devices in a chip that includes high-performance transistors with thin gate oxide layers, low power devices with thicker gate oxide layers, and high voltage input/output ports.

Forming more than two oxide layers having differing thicknesses conventionally utilizes a method where oxide layers are partially removed before forming other oxide layers. Then, additional oxide layers are deposited on the gate predetermined region from which the oxide layers have been partially removed. Photolithography can be used to remove oxide layers. However, this may result in reduced transistor performance and increased leakage current.

A method of fabricating a plurality of gate oxide layers without performing the photolithographic etching process is disclosed in U.S. Pat. No. 6,147,008 entitled "CREATION OF MULTIPLE GATE OXIDE WITH HIGH THICKNESS RATIO IN FLASH MEMORY PROCESS" by Siow Lee Chwa et al.

Figure 1:
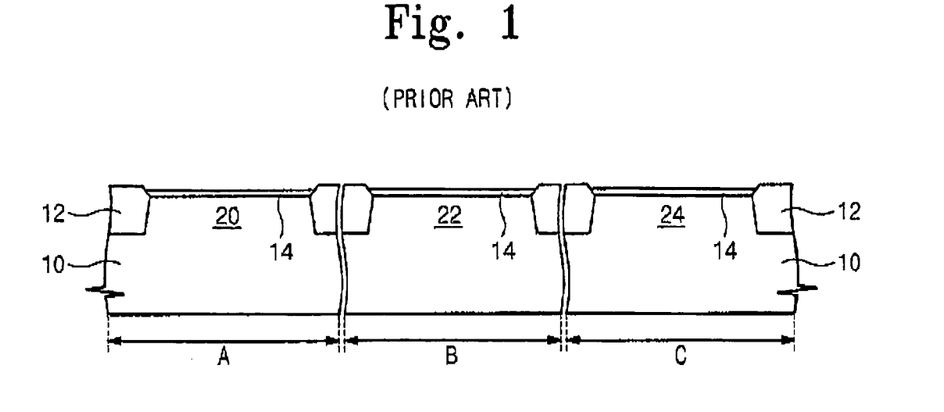
FIG. 1–FIG. 3 are cross-sectional views illustrating conventional methods of fabricating triple gate insulating layers.
Figure 2:
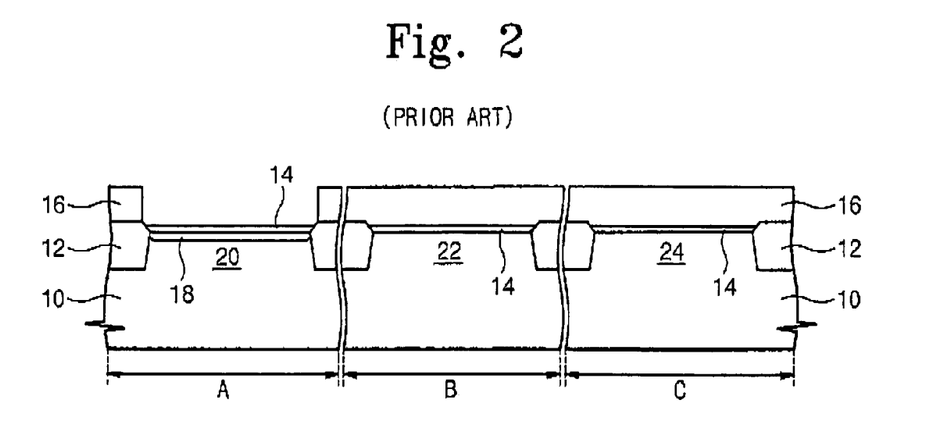
Figure 3:
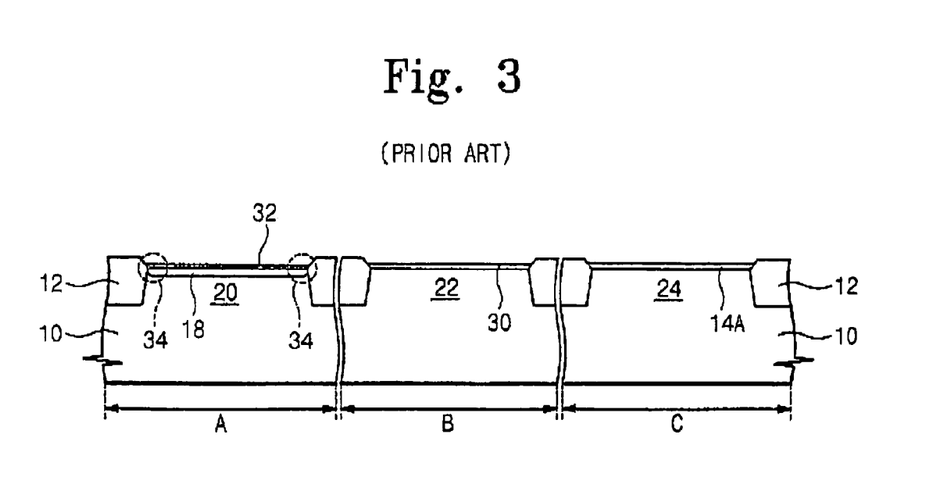

FIG. 1 to FIG. 3 are cross-sectional views of such a conventional method of fabricating triple gate oxide layers. Region A illustrates a part of the semiconductor substrate including high-performance transistors, region B illustrates a part of the substrate including low power transistors, and region C illustrates a part of the substrate including input/output devices.

Referring to FIG. 1, a plurality of active regions are defined by forming an isolation layer 12 on a semiconductor substrate 10. As a matter of convenience, active regions of region A are defined as a first active region 20, active regions of region B are defined as a second active region 22, and active regions of region C are defined as a third active region 24. As shown in FIG. 1, a first oxide layer 14 is formed on the semiconductor substrate that includes the isolation layer 12.

Referring to FIG. 2, a photoresist layer is formed on the entire semiconductor substrate 10 including the first oxide layer 14. The photoresist layer is patterned to form a photoresist pattern 16 exposing the first active region 20. Nitrogen ions are then implanted into the semiconductor substrate 10 to form an oxidation barrier layer 18, using the photoresist pattern 16 as an ion implantation mask.

Referring to FIG. 3, the photoresist pattern 16 is removed. The first oxide layer 14 is also removed from the first active region 20 and the second active region 22. A second oxide layer is formed on the entire semiconductor substrate 10. As a result, a first gate oxide layer 32 and a second gate oxide layer 30 are respectively formed on the first active region 20 and the second active region 22. However, the oxidation barrier layer 18 suppresses oxidation of the first active region 20. Thus, the thickness of the first gate oxide layer 32 is thinner than that of the second gate oxide layer 30. The thickness of the second gate oxide layer 30 is the same as that of the second oxide layer formed on the semiconductor substrate. A third gate oxide layer 14A is formed on the third active region 24, and is composed of a combination of the first oxide layer and the second oxide layer.

Accordingly, in methods of fabricating triple gate oxide layers according to the prior art, a thinner oxide layer may be formed by implanting nitrogen in active regions. As such, a semiconductor device including gate oxide layers of different thicknesses may be formed. However, implanting nitrogen ions into the substrate may cause crystalline damage. When crystalline damage overlaps with the transistor junctions, transistor leakage current may be increased. In particular, leakage current may be increased at PMOS transistor junctions positioned on an edge of the active regions. Moreover, it may be difficult to control the thickness of the oxide layers when using nitrogen ion implantation.

SUMMARY OF THE INVENTION

Embodiments of the present invention provide semiconductor devices and methods of fabricating semiconductor devices that include a first gate pattern on a first active area of a semiconductor substrate. The first gate pattern has a top width that is substantially the same as or less than a bottom width of the first gate pattern. A second gate pattern is provided on a second active area of the semiconductor substrate. The second gate pattern has a top width that is wider than a bottom width of the second gate pattern.

In further embodiments of the present invention, a third gate pattern is provided on a third active area of the semiconductor substrate. The third gate pattern has a top width that is wider than a bottom width of the third gate pattern. A first gate insulating layer may also be disposed between the first gate pattern and the first active area and have a first thickness. A second gate insulating layer may be disposed between the second gate pattern and the second active area and have a second thickness that is greater than the first thickness of the first gate insulating layer. A third gate insulating layer may be disposed between the third gate pattern and the third active area and have a third thickness that is greater than the second thickness of the second gate insulating layer.

In additional embodiments of the present invention, respective silicide layers are provided on the first gate pattern, the second gate pattern and the third gate pattern. Impurity diffusion regions may also be provided in respective ones of the first, second and third active regions adjacent sides of the first, second and third gate patterns.

In still further embodiments of the present invention, the second and third gate patterns include a conductive adhesion layer having a substantially "U" shaped cross section and a metal layer in a gap region of the conductive adhesion layer.

In other embodiments of the present invention, fabrication of a semiconductor device includes forming a first gate pattern on a first gate insulation layer formed on a first active region of a semiconductor substrate. A mask insulation layer is formed on the semiconductor substrate that includes the first gate pattern. First and second gate openings respectively exposing second and third active regions of the semiconductor substrate are formed by patterning the mask insulation layer. Second and third gate insulation layers are respectively formed on second and third active regions exposed in the first and second gate openings. Second and third gate patterns are formed in the first and second gate openings respectively and the mask insulation layer is removed.

In additional embodiments of the present invention, a top width of the first and second gate openings is wider than a bottom width of the first and second gate openings.

In yet further embodiments of the present invention, forming second and third gate insulation layers includes forming a first insulation layer on the semiconductor substrate in the first and second gate openings, exposing the second active region in the first gate opening by removing the first insulation layer in the first gate opening and forming a second insulation layer on the semiconductor substrate including on the second active region exposed by the first gate opening to provide the second gate insulation layer. Forming a second insulation layer on the semiconductor substrate may also include forming a second insulation layer on the semiconductor substrate including on the first insulation layer in the second gate opening so as to provide a third gate insulation layer comprising the first insulation layer and the second insulation layer in the second gate opening.

In additional embodiments of the present invention, the mask insulation layer is conformally formed, and forming the first and second gate openings includes forming a photoresist layer on the mask insulation layer, removing an upper portion of the photoresist layer to expose the mask insulation layer on first gate pattern, patterning the photoresist layer to expose a portion of the mask insulation layer corresponding to the first and second gate openings, and etching the mask insulation layer using the photoresist layer as an etching mask.

In still further embodiments of the present invention, forming the second and third gate patterns includes forming a conductive adhesion layer on the semiconductor substrate including on the second and third gate insulation layers in the first and second gate openings, forming a metal layer on the conductive adhesion layer, and planarizing the metal layer and the conductive adhesion layer to form the second and third gate patterns in the first and second gate openings.

DETAILED DESCRIPTION OF THE INVENTION

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of the layers and regions are exaggerated for clarity. It will also be understood that when a layer is referred to as being "on" another layer or substrate, it can be directly on the other layer or substrate or intervening layers may be also be present. Like numbers refer to like elements throughout the specification. As used herein the term "and/or" includes any and all combinations of one or more of the associated listed items.

It will be understood that although the terms first and second may be used herein to describe various regions, layers, and/or sections, these regions, layers, and/or sections should not be limited by these terms. These terms are only used to distinguish one region, layer, or section from another region, layer, or section. Thus, a first region, layer, or section discussed below could be termed a second region, layer, or section, and similarly, a second without departing from the teachings of the present invention.

Figure 4:
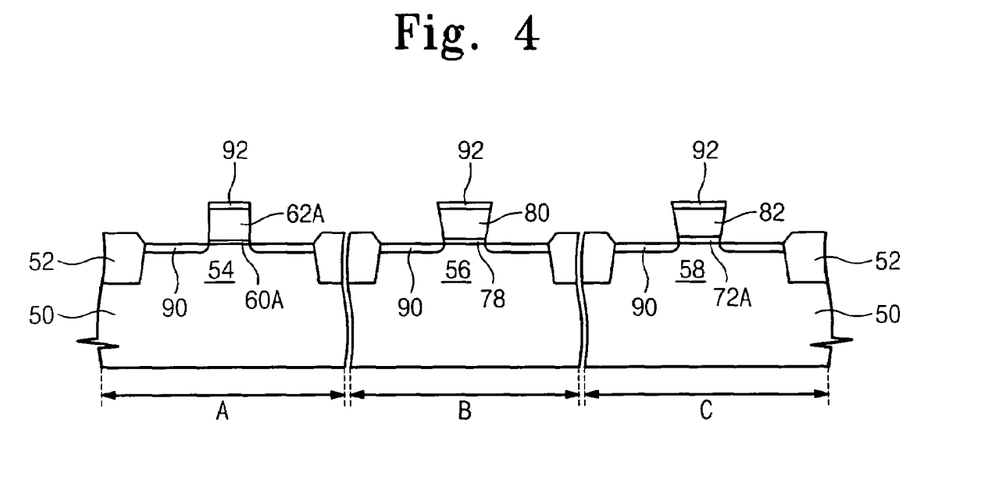
FIG. 4 is a cross-sectional view of a semiconductor device according to embodiments of the present invention.

FIG. 4 is a cross-sectional view of semiconductor devices according to certain embodiments of the present invention.

Referring to FIG. 4, an isolation layer 52 is provided on the semiconductor substrate 50 to define a plurality of active regions. The active regions include a first active region 54, a second active region 56, and a third active region 58. A first gate pattern 62A is provided on the first active region 54, a second gate pattern 80 is provided on the second active region 56, and a third gate pattern 82 is provided on the third active region 58. Each gate pattern crosses over its corresponding active region and partially overlaps a corresponding field insulation layer adjacent to the active regions.

Still referring to FIG. 4, a first gate insulation layer 60A is provided between the first gate pattern 62A and the first active region 54. A second gate insulation layer 78 is provided between the second gate pattern 80 and the second active region 56. A third gate insulation layer 72A is provided between the third gate pattern 82 and the third active region 58. The first, second and third gate insulation layers 60A, 78, and 72A may differ in thickness. High-performance transistors may be formed on regions with thin gate oxide layers. Low power transistors may be formed on regions with thicker gate insulation layers. Transistors with high voltage inputs/outputs may have even thicker gate insulation layers. Accordingly, high performance transistors, low power transistors, and transistors with high voltage inputs/outputs may be formed on the first, second and third active regions 54, 56, and 58, respectively. The first gate insulation layer 60A is formed to a relatively thin thickness. The thickness of the second gate insulation layer 78 is thicker than that of the first gate insulation layer 60A, and the thickness of the third gate insulation layer 72A may be thicker than that of the second gate insulation layer 78.

Furthermore, according to embodiments of the present invention, the second and third gate patterns 80 and 82 each have top widths that are wider than their respective bottom widths. Therefore, if a silicide layer 92 is formed on top of the gate patterns 80 and 82, it is possible to decrease gate electrode resistance.

FIG. 5 to FIG. 14 are cross-sectional views illustrating methods of fabricating semiconductor devices according to certain embodiments of the present invention.

Figure 5:
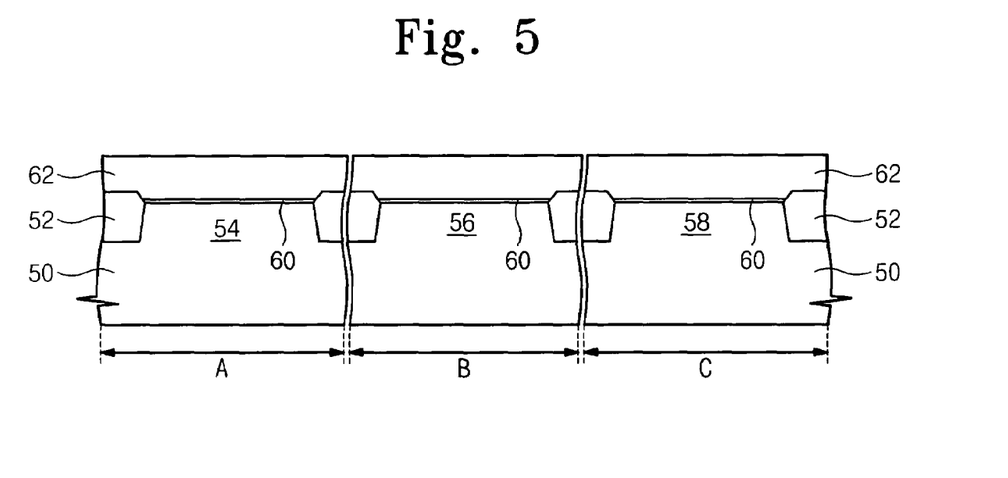
FIG. 5–FIG. 14 are cross-sectional views illustrating the fabrication of semiconductor devices according to embodiments of the present invention.

Referring to FIG. 5, an isolation layer 52 is formed on a semiconductor substrate 50 to define first, second, and third active regions 54, 56, and 58, respectively. A first insulation layer 60 is formed on the first, second, and third active regions 54, 56, and 58. The first insulation layer 60 may be formed by thermal oxidation and/or chemical vapor deposition (CVD). In addition, the first insulation layer 60 may be formed of silicon oxide, silicon oxynitride, and/or metal oxide.

Still referring to FIG. 5, a first conductive layer 62 is formed on the semiconductor substrate 50 that includes the first insulation layer 60. The first conductive layer 62 may be formed of polysilicon, stacked layers of polysilicon and silicide, and/or stacked layers of polysilicon and metal. In addition, an anti-reflecting layer may be formed on the first conductive layer 62.

Figure 6:
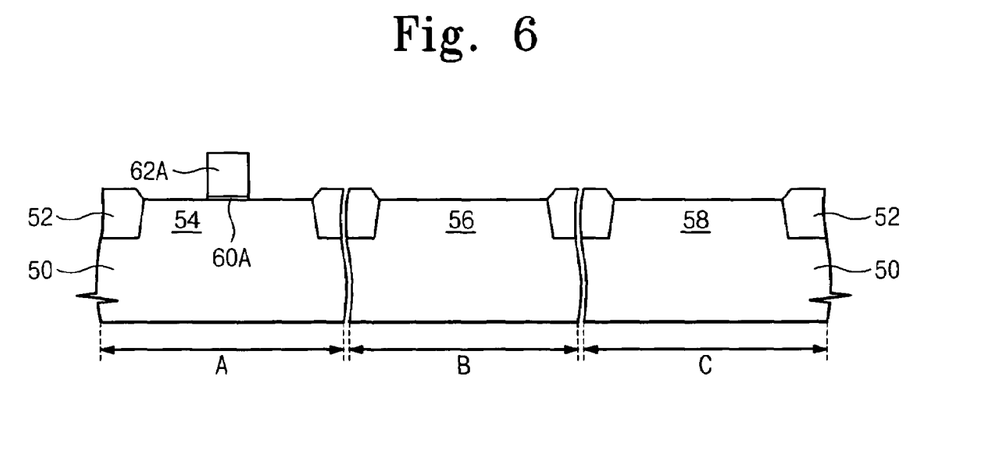

Referring to FIG. 6, a first gate pattern 62A crossing over the first active region 54 is formed by patterning the first conductive layer 62. The first gate insulation layer 60A is positioned between the first gate pattern 62A and the first active region 54. The first gate insulation layer 60A may reside under the first gate pattern 62A on the first active region 54.

Figure 7:
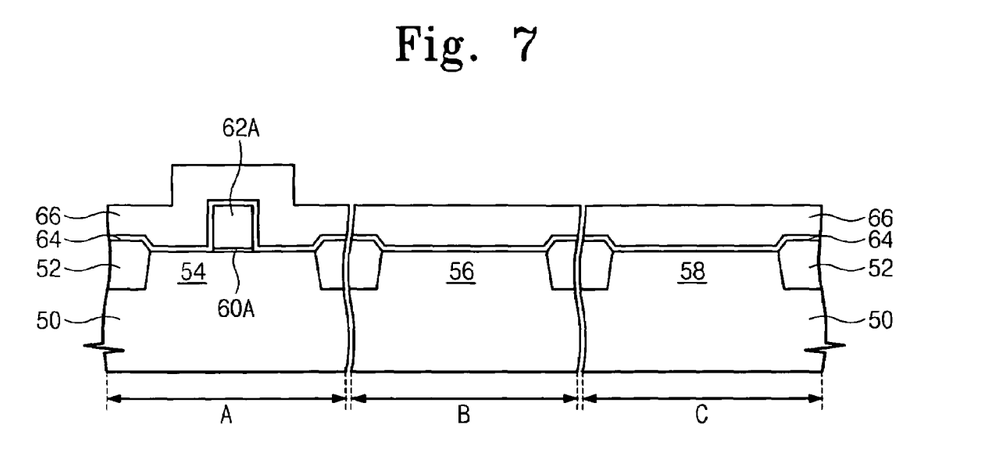

Referring to FIG. 7, a mask insulation layer 66 is formed on the surface of the semiconductor substrate 50. The mask insulation layer 66 may be formed of silicon nitride. As shown in FIG. 7, the mask insulation layer 66 may be formed conformally over the surface of the semiconductor substrate 50. In certain embodiments of the present invention, a buffer oxide layer 64 may be formed on the semiconductor substrate 50 before forming the mask insulation layer 66. The buffer oxide layer 64 can reduce stress on the active regions if a silicon nitride mask insulation layer is used.

Figure 8:
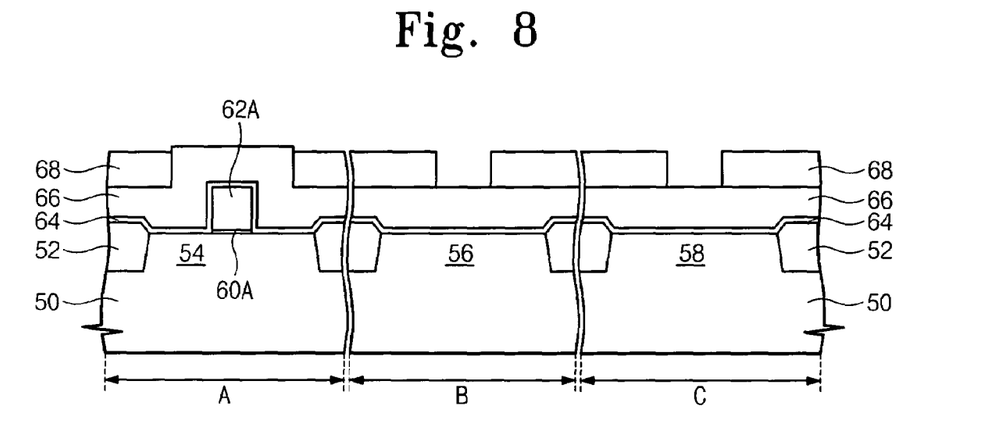

Referring to FIG. 8, a first photoresist pattern 68 is formed on the mask insulation layer 66. The first photoresist pattern 68 exposes parts of the mask insulation layer 66 formed over the second and third active regions 56 and 58. The exposed regions of the mask insulation layer 66 correspond to second and third gate patterns that are subsequently formed.

Still referring to FIG. 8, when the mask insulation layer 66 is formed conformally, the height of the mask insulation layer 66 on the first gate pattern 62A is higher than that of the other regions. Therefore, in certain embodiments of the present invention, the portion of the photoresist pattern 68 that is over both the mask insulation layer 66 and the first gate pattern 62A may be removed. Conventional photoresist recessing techniques may be used to remove a part of the photoresist pattern 68 by baking the photoresist film at a specific temperature to partially develop the photoresist film. Thus, as shown in FIG. 8, a part of the mask insulation layer 66 on top of the first gate pattern 62A may be exposed by recessing the photoresist pattern 68.

Figure 9:
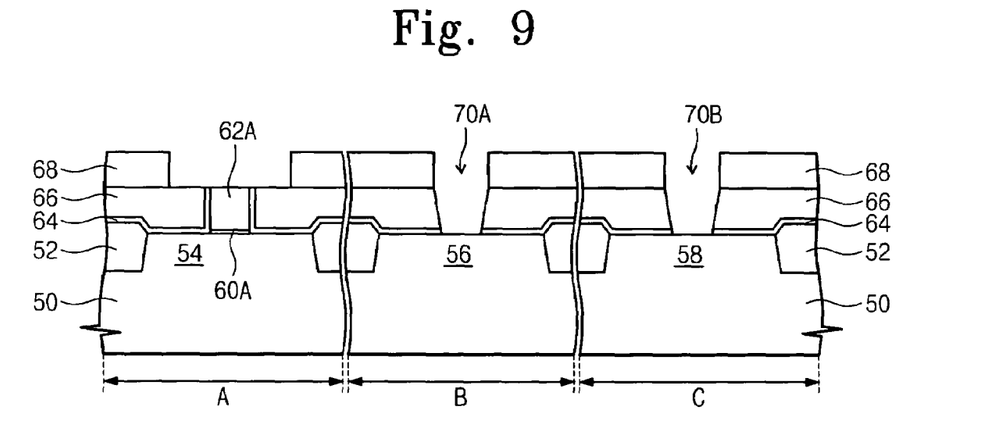

Referring to FIG. 9, the mask insulation layer 66 is etched using the first photoresist pattern 68 as an etching mask. As a result, first and second openings 70A and 70B over second and third active regions 56 and 58 are respectively formed. The buffer oxide layer 64 is also removed to expose part of the second and third active regions 56 and 58. The first and second gate openings 70A and 70B are wider at the top than at the bottom. Also, part of the mask insulation layer 66 that is formed on top of the first gate pattern 62A may be removed.

Figure 10:
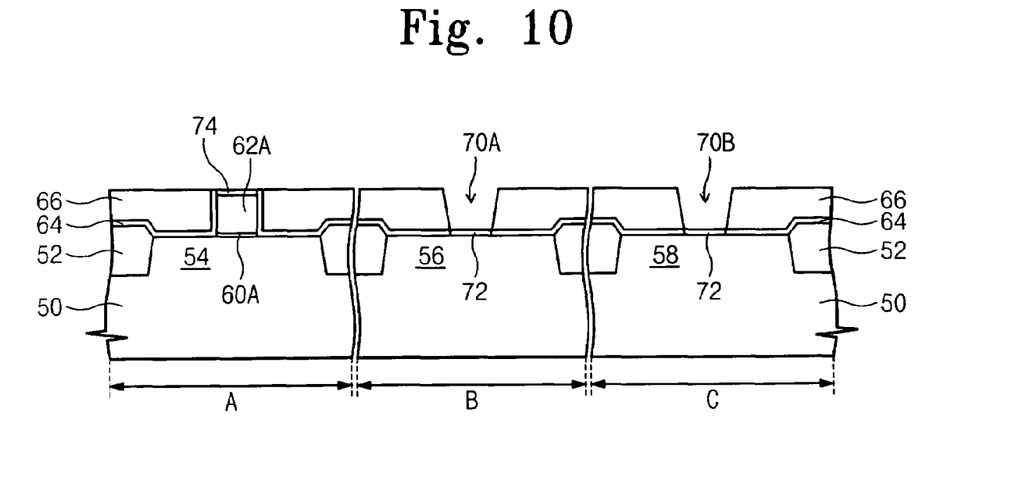

Referring to FIG. 10, the first photoresist pattern 68 is removed. A second insulation layer 72 is then formed on second and third active regions 56 and 58 at first and second gate openings 70A and 70B, respectively. The second insulation layer 72 may be formed by thermal oxidation and/or CVD. When thermal oxidation is used to form the second insulation layer 72, an oxide layer 74 may be formed on top of the first gate pattern 62A.

Figure 11:
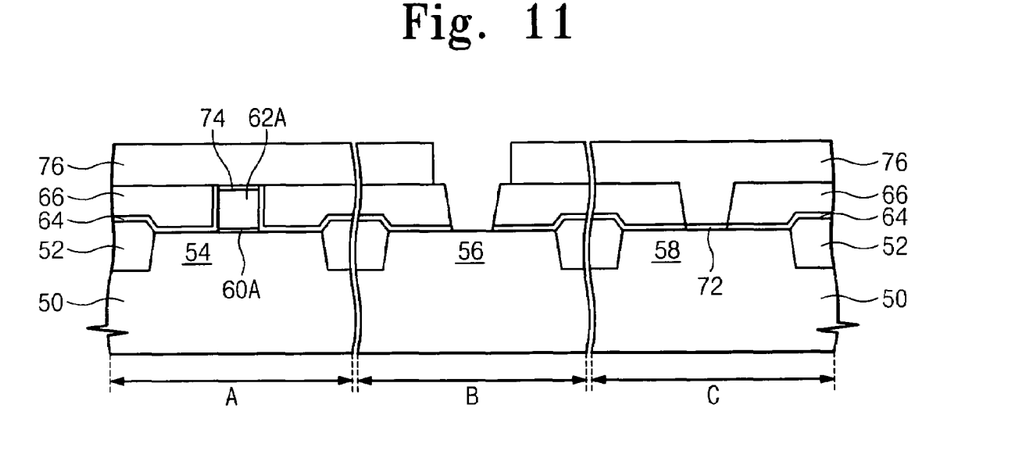

Referring to FIG. 11, a second photoresist pattern 76 is formed on the substrate 50, which exposes the first gate opening 70A. The second insulation layer 72 in the first gate opening 70A is then removed, using the second photoresist pattern 76 as an etching mask.

Figure 12:
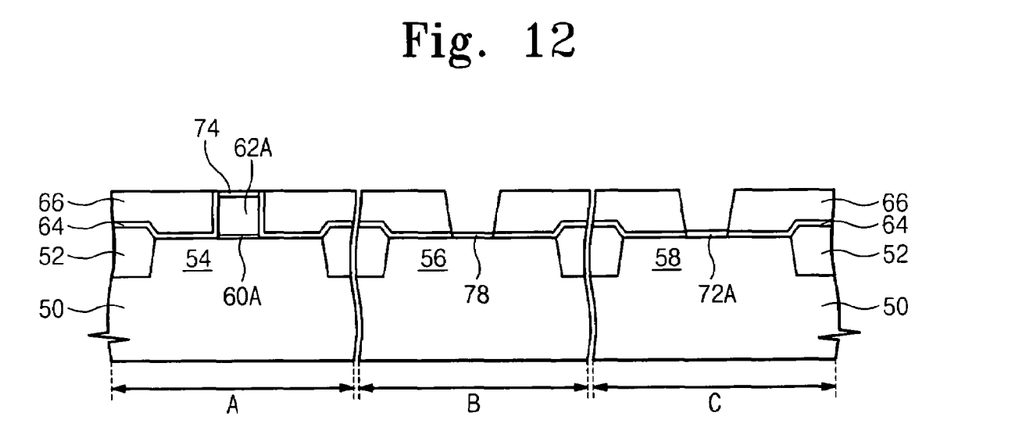

Referring to FIG. 12, the second photoresist pattern 76 is removed, and a third insulation layer is formed on second and third active regions 56 and 58 at first and second gate openings 70A and 70B. The third insulation layer may be formed by thermal oxidation and/or CVD. As a result, a second gate insulation layer 78 is formed on the second active region 56 at first gate opening 70A, and a third gate insulation layer 72A is formed on the third active region 58 at the second gate opening 70B. The third gate insulation layer 72A includes the second insulation layer 72 and the third insulation layer.

Thus, the second gate insulation layer 78 is formed from a single insulation layer, while the third gate insulation layer 72A is formed from two insulating layers. As a result, the third gate insulation layer 72A is thicker than the second gate insulation layer 78.

Figure 13:
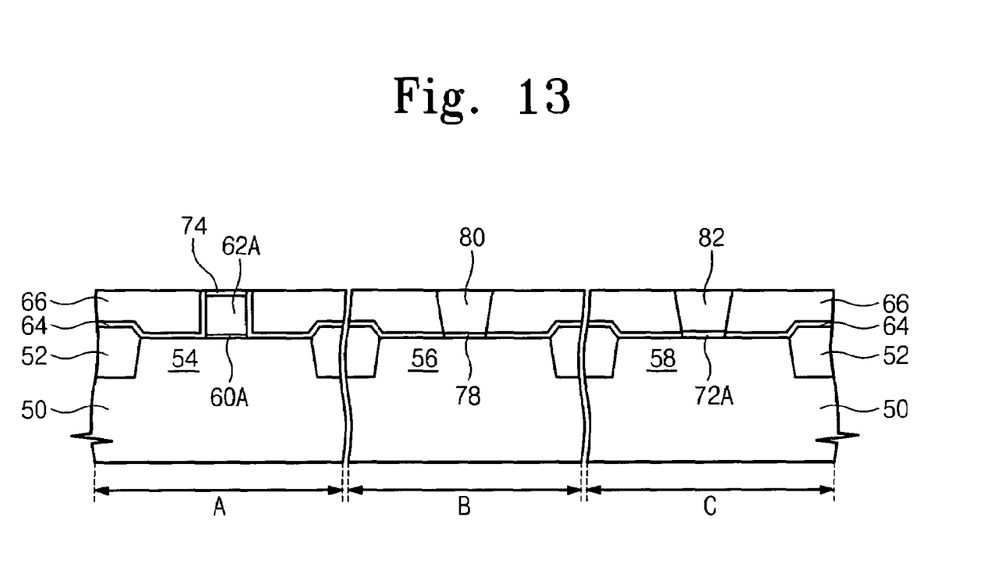

Referring to FIG. 13, a second conductive layer, which fills the first gate opening 70A and the second gate opening 70B, is formed on the semiconductor substrate 50. The second conductive layer may be formed of polysilicon and/or silicon germanium. The second conductive layer is then planarized by, for example, chemical-mechanical polishing, so that a second gate pattern 80 and a third gate pattern 82 are formed in first and second gate openings 70A and 70B. A silicide layer may also be formed on second and third gate patterns 80 and 82 by silicidization of the semiconductor substrate 50, including the second and third gate pattern patterns 80 and 82.

Figure 14:
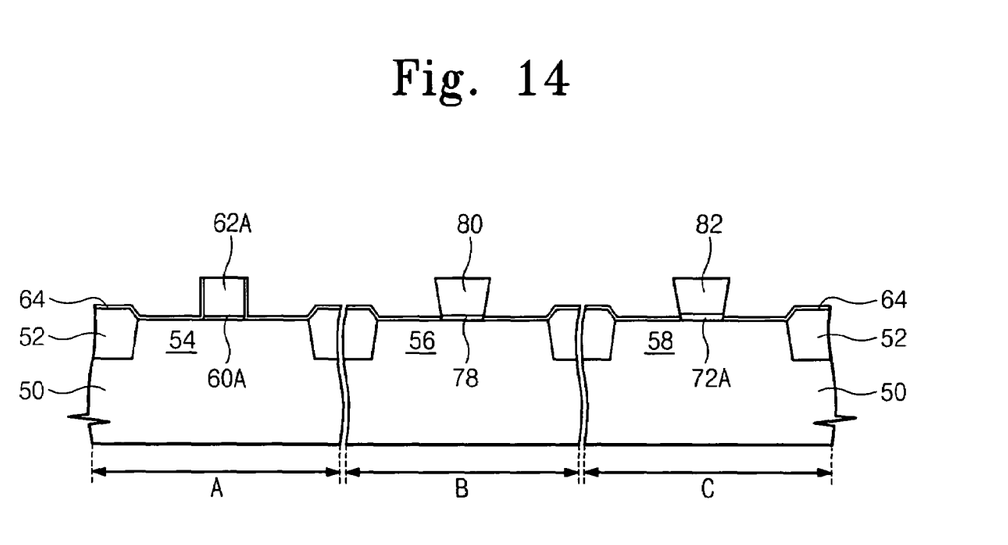

Referring to FIG. 14, both sidewalls of the first, second and third gate patterns 62A, 80, and 82 are exposed by removing the mask insulation layer 66. The buffer oxide layer 64 may be either removed or retained. Thus, the first gate pattern 62A is formed on the first active region 54, the second gate pattern 80 is formed on the second active region 56, and the third gate pattern 82 is formed on the third active region 58. The second and third gate patterns 80 and 82 each have a top width that is wider than the bottom width. In other words, the width of portions of the gate patterns 80 and 82 is less proximate the insulating layers 78 and 72A than the width of portions of the gate patterns 80 and 82 distal from the insulating layers 78 and 72A.

Impurity diffusion layers may be formed by implanting impurities in active regions at both sidewalls of the first, second, and third gate patterns 62A, 80, and 82. If a silicide layer has not yet been formed on the first, second, and third gate patterns 62A, 80 and 82, a silicide layer may be formed by silicidization of the impurity diffusion layers and the tops of the first, second, and third gate patterns 62A, 80, and 82.

Figure 15:
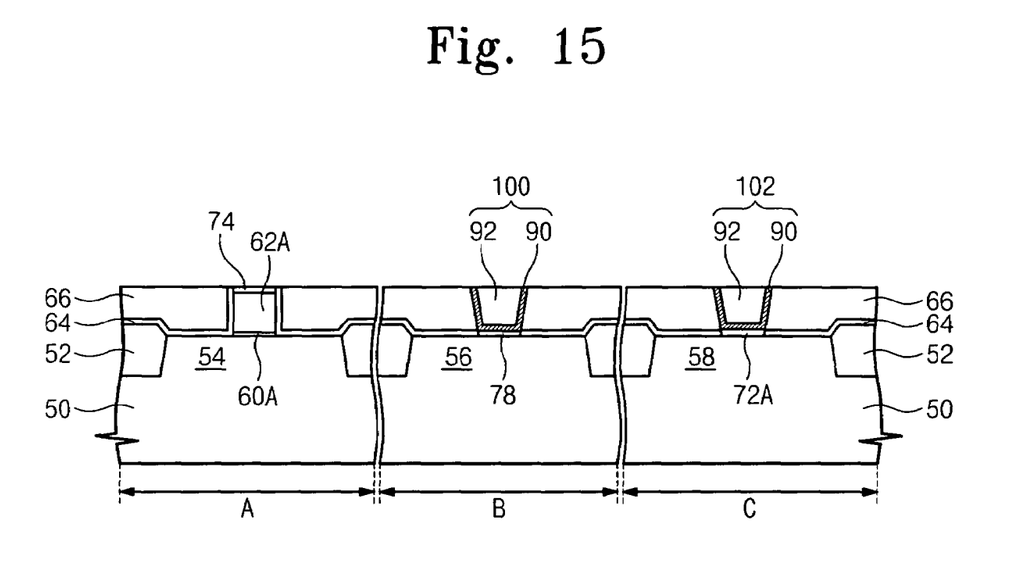
FIG. 15–FIG. 16 are cross-sectional views illustrating the fabrication of semiconductor devices according to further embodiments of the present invention.
Figure 16:
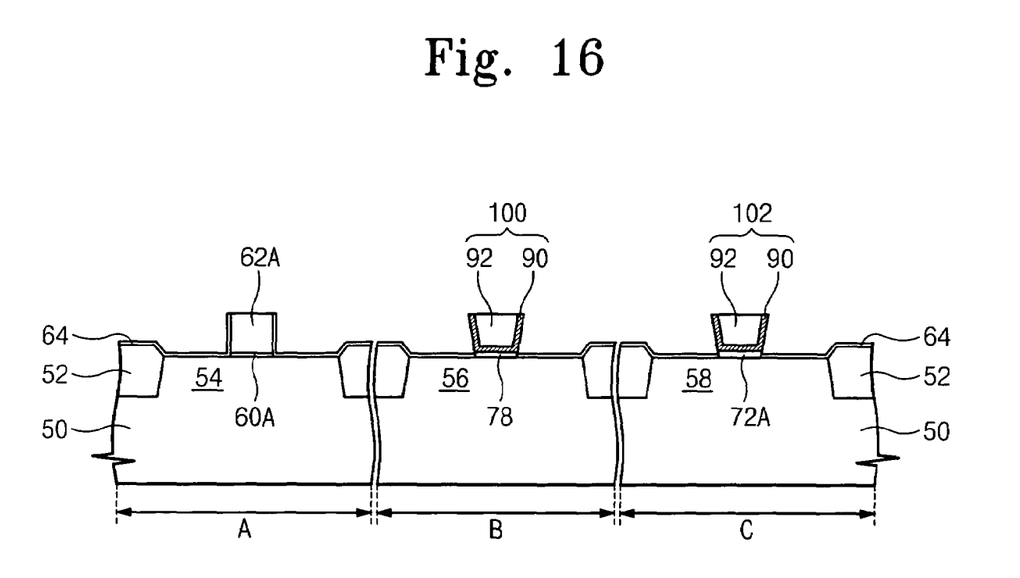

FIG. 15 and FIG. 16 are cross-sectional views of methods of fabricating semiconductor devices according to further embodiments of the present invention.

Referring to FIG. 15, the second gate insulation layer 78 is formed on the second active region 56 at the first gate opening 70A, and the third gate insulation layer 72A is formed on the third active region 58 at the second gate opening 70B, by forming a third insulation layer as discussed above with reference to FIG. 12. A conductive adhesion layer 90 and a metal layer 92 are formed on the semiconductor substrate 50. In particular embodiments of the present invention, the conductive adhesion layer 90 may be formed of polysilicon, silicon germanium, and/or titanium nitride or the like. The metal layer 92 may be formed of tungsten.

Still referring to FIG. 15, the metal layer 92 and the conductive adhesion layer 90 are polished by a planarization process, such as chemical-mechanical polishing. As a result, second and third gate patterns 100 and 102 are formed in the first and second gate openings 70A and 70B, respectively.

Referring to FIG. 16, sidewalls of the first, second, and third gate patterns 62A, 100, and 102 are exposed by removing the mask insulation layer 66. The buffer oxide layer 64 may either be removed or retained. Thus, the first gate pattern 62A is formed on the first active region 54, the second gate pattern 100 is formed on the second active region 56, and the third gate pattern 102 is formed on the third active region 58. The second and third gate patterns 100 and 102 include the conductive adhesion layer 90 and the metal layer 92. The conductive adhesion layer 90 has a "U" shaped cross section, and the metal layer 92 has good electric conductivity.

Certain embodiments of the present invention may provide gate insulation layers of low power transistors that may not be contaminated by the photoresist layer, because the first gate insulation layer is formed to a thinner thickness and the second and third gate insulation layers are formed through a DAMASCENE process to a thicker thickness. High performance transistors with low leakage current may also be formed, because physical damage to the substrate due to nitrogen ion implantation may be avoided. Furthermore, the second and third gate patterns can each have a top width that is wider than the bottom width. Because the top dimensions of the gate pattern are thereby increased in the same channel width, the gate resistance can be decreased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, comprising:
   forming a first gate pattern on a first gate insulation layer formed on a first active region of a semiconductor substrate;
   forming a mask insulation layer on the semiconductor substrate that includes the first gate pattern;
   forming first and second gate openings respectively exposing second and third active regions of the semiconductor substrate by patterning the mask insulation layer;
   forming second and third gate insulation layers respectively on second and third active regions exposed in the first and second gate openings;
   forming second and third gate patterns in the first and second gate openings respectively; and
   removing the mask insulation layer.

2. The method of fabricating a semiconductor device according to claim 1, wherein a top width of the first and second gate openings is wider than a bottom width of the first and second gate openings.

3. The method of fabricating a semiconductor device according to claim 1, wherein forming second and third gate insulation layers further comprises:
   forming a first insulation layer on the semiconductor substrate in the first and second gate openings;
   exposing the second active region in the first gate opening by removing the first insulation layer in the first gate opening; and
   forming a second insulation layer on the semiconductor substrate including on the second active region exposed by the first gate opening to provide the second gate insulation layer.

4. The method of fabricating a semiconductor device according to claim 3, wherein forming a second insulation layer on the semiconductor substrate further comprises forming a second insulation layer on the semiconductor substrate including on the first insulation layer in the second gate opening to provide the third gate insulation layer comprising the first insulation layer and the second insulation layer in the second gate opening.

5. The method of fabricating a semiconductor device according to claim 2, wherein the mask insulation layer is conformally formed, and wherein forming the first and second gate openings comprises:
   forming a photoresist layer on the mask insulation layer;
   removing an upper portion of the photoresist layer to expose the mask insulation layer on the first gate pattern;
   patterning the photoresist layer to expose a portion of the mask insulation layer corresponding to the first and second gate openings; and
   etching the mask insulation layer using the photoresist layer as an etching mask.

6. The method of fabricating a semiconductor device according to claim 1, wherein forming the second and third gate patterns comprises:
   forming a conductive adhesion layer on the semiconductor substrate including on the second and third gate insulation layers in the first and second gate openings;
   forming a metal layer on the conductive adhesion layer; and
   planarizing the metal layer and the conductive adhesion layer to form the second and third gate patterns in the first and second gate openings.

7. A method of fabricating a semiconductor device, the method comprising:
   forming a first gate pattern on a first active area of a semiconductor substrate, the first gate pattern having a top width that is substantially the same as or less than a bottom width of the first gate pattern;
   forming a second gate pattern on a second active area of the semiconductor substrate, the second gate pattern having a top width that is wider than a bottom width of the second gate pattern; and
   forming a third gate pattern on a third active area of the semiconductor substrate, the third gate pattern having a top width that is wider than a bottom width of the third gate pattern.

8. The method of fabricating a semiconductor device according to claim 7, further comprising:
   forming a first gate insulating layer disposed between the first gate pattern and the first active area and having a first thickness;

forming a second gate insulating layer disposed between the second gate pattern and the second active area and having a second thickness that is greater than the first thickness of the first gate insulating layer; and forming a third gate insulating layer disposed between the third gate pattern and the third active area and having a third thickness that is greater than the second thickness of the second gate insulating layer.

9. The method of fabricating a semiconductor device according to claim 7, further comprising forming respective suicide layers on the first gate pattern, the second gate pattern and the third gate pattern.

10. The method of fabricating a semiconductor device according to claim 7, further comprising forming impurity diffusion regions in respective ones of the first, second and third active regions adjacent sides of the first, second and third gate patterns.

11. The method of fabricating a semiconductor device according to claim 7, wherein forming the second and third gate patterns further comprise:

forming a conductive adhesion layer having a substantially "U" shaped cross section; and forming a metal layer in a gap region of the conductive adhesion layer.

* * * * *

UNITED STATES PATENT AND TRADEMARK OFFICE
CERTIFICATE OF CORRECTION

| | |
|---|---|
| PATENT NO. | : 7,151,031 B2 |
| APPLICATION NO. | : 10/794445 |
| DATED | : December 19, 2006 |
| INVENTOR(S) | : H. Kwon et al. |

It is certified that error appears in the above-identified patent and that said Letters Patent is hereby corrected as shown below:

<u>Title Page</u>

Section 74, Correct "PA" to read --P.A.--

<u>Column 9</u>

Line 11, Correct "suicide" to read --silicide--.

Signed and Sealed this

Third Day of April, 2007

JON W. DUDAS
*Director of the United States Patent and Trademark Office*